United States Patent [19]

Bates

[11] Patent Number: 5,162,741

[45] Date of Patent: Nov. 10, 1992

[54] TEMPERATURE COMPENSATED LITHIUM BATTERY ENERGY MONITOR

[75] Inventor: Albert M. Bates, Southampton, Pa.

[73] Assignee: The United States of America as represented by the Secretary of the Navy, Washington, D.C.

[21] Appl. No.: 682,159

[22] Filed: Apr. 3, 1991

[51] Int. Cl.⁵ .......................................... G01N 27/416
[52] U.S. Cl. .................................... 324/431; 324/427; 320/48; 340/636
[58] Field of Search ...................... 324/426, 427, 431; 320/48; 340/636

[56] References Cited

U.S. PATENT DOCUMENTS

| | | | |
|---|---|---|---|
| 3,781,658 | 12/1973 | Godshalk | 324/431 |
| 3,940,679 | 2/1976 | Brandwein et al. | 324/426 X |
| 4,377,787 | 3/1983 | Kikuoka et al. | 324/431 |
| 4,423,378 | 12/1983 | Marino et al. | 324/427 |
| 4,725,784 | 2/1988 | Peled et al. | 324/427 |
| 4,866,471 | 9/1989 | Ikuta | 324/431 X |
| 4,947,123 | 8/1990 | Minezawa | 324/427 |
| 4,949,046 | 8/1990 | Seyfang | 324/427 |
| 5,047,961 | 9/1991 | Simonsen | 340/636 X |

*Primary Examiner*—Kenneth A. Wieder
*Assistant Examiner*—Glenn W. Brown
*Attorney, Agent, or Firm*—James V. Tura; James B. Bechtel; Susan E. Verona

[57] ABSTRACT

A system is provided for temperature compensating and monitoring the energy of a lithium battery. In this method, a temperature compensation factor is determined according to a value of temperature. A determination is made of the energy usage while the battery operates at that temperature. The temperature usage is then compensated in accordance with the temperature compensation factor. A second temperature, along with a second temperature compensation factor, is determined. A second energy level is determined and compensated as described for the first. A cumulative energy usage is determined according to the first and second compensated energy usage values.

10 Claims, 5 Drawing Sheets

TEMPERATURE COMPENSATED LITHIUM BATTERY ENERGY MONITOR

STATE OF GOVERNMENT INTEREST

The invention described herein may be manufactured and used by and for the United States of America for governmental purposes without the payment of any royalties thereon or therefor.

BACKGROUND OF THE INVENTION

This invention relates to the field of monitoring the energy level of storage batteries and in particular to a device for temperature compensating such measurements. At this time, approximately twenty million dollars is spent per year for lithium batteries for portable communication equipment. This is expected to increase to fifty million dollars a year in a few years when most of the batteries for portable communication equipment are lithium. Therefore it is beneficial to provide a monitor device for conveniently and reliably determining the remaining charge level or energy level of lithium batteries by the equipment operator.

The lack of such an energy monitor device has been a major cost of waste due to the disposal of partly used batteries. Conversely, if there is no means for determining the charge level of the lithium batteries, it cannot be determined when the battery needs to be replaced. This creates a potentially hazardous situation for the operator at low end voltage of the battery. It also results in reduced safety and reliability since partially used batteries which are not disposed of may be exhausted at inopportune times. Thus it is desirable to develop a low cost, lithium battery energy monitor which will provide a visual indication of the energy remaining in the battery to a user of equipment powered by lithium batteries.

It is known in the art to monitor battery consumption using monitor circuits. U.S. Pat. No. 4,556,061 issued to Barrerars on Dec. 3, 1985, detects the voltage drop across a resistor in series with batteries supplying current to a cardiac pacer system. The voltage drop is amplified and applied to a voltage controlled oscillator which provides a pulse wave proportional to current flow through the resistor. A counter provides a cumulative count which represents battery consumption. External magnetic interrogation signals are applied to the pacer to retrieve the charge data. However, the system of Barrears does not provide any temperature compensation.

U.S. Pat. No. 3,895,284, issued to Schwiezer on Jul. 15, 1975, teaches the monitoring of starter batteries for motor vehicles. While the system of Schwiezer teaches the subject of temperature compensation, it does not compensate state of charge calculations on a continuous basis.

U.S. Pat. No. 4,323,849, issued to Smith discloses a coulometer wherein a signal representative of charge associated with a storage battery is applied to an integrator. The number of ampere-hours of available charge are displayed and some temperature compensation is performed. However, in the system of Smith temperature compensation is only performed with respect to thermal effects within the electronics rather than the temperature of the battery being monitored.

U.S. Pat. No. 3,906,329, issued to Bader, teaches a method for measuring the charge condition of galvanic energy sources and an apparatus for carrying out the method. However, the method and system of Bader measure charging current, or a magnetic property thereof, and weighs this with a factor dependent on the predetermined gassing voltage which changes with temperature. Furthermore, Bader pertains to secondary, rechargeable batteries. Thus Bader does not teach a method of measuring the relevant properties of primary lithium batteries, such as the remaining charge level in the battery.

U.S. Pat. No. 3,344,343, issued to John, teaches a retained capacity indicator using a mercury coulometer and thermister. Thus, the system of John does not provide a method of monitoring primary batteries so that the cumulative charge used is continually accounted for and compensated for temperature. Additionally, John does not at any time provide the percent of charge remaining which is available to the user.

Therefore, a monitor is needed to reduce indiscriminate replacement of partially used primary batteries during field operation and to permit reuse of partially discharged primary batteries. In order to achieve this a determination of battery performance parameters which feature very flat voltage discharge curves it is necessary to measure charge unit time, to add and store the results, and to activate appropriate visual indicators. A press-to-test status button is suggested to prevent the indicator from consuming power when not in use.

An object of this invention is a low cost lithium battery energy monitor that provides a visual indication of energy remaining.

A further object of this invention is to automatically process and integrate charge based upon activation of the load on the battery.

It is a further object of this device to provide a readout activated by a test switch.

In addition to monitoring current drain, the temperature must also be monitored since the rate of battery discharge varies significantly with temperature.

BRIEF DESCRIPTION OF THE DRAWINGS

Other objects, advantages and novel features of the invention will become apparent from the following detailed description of the invention when considered in conjunction with the accompanying drawings wherein.

SUMMARY OF THE INVENTION

A system is provided for temperature compensating and monitoring the energy of a lithium battery. In this method, a temperature compensation factor is determined according to a value of temperature. A determination is made of the energy usage while the battery operates at that temperature. The temperature usage is then compensated in accordance with the temperature compensation factor.

DETAILED DESCRIPTION OF THE INVENTION

Figure 1:
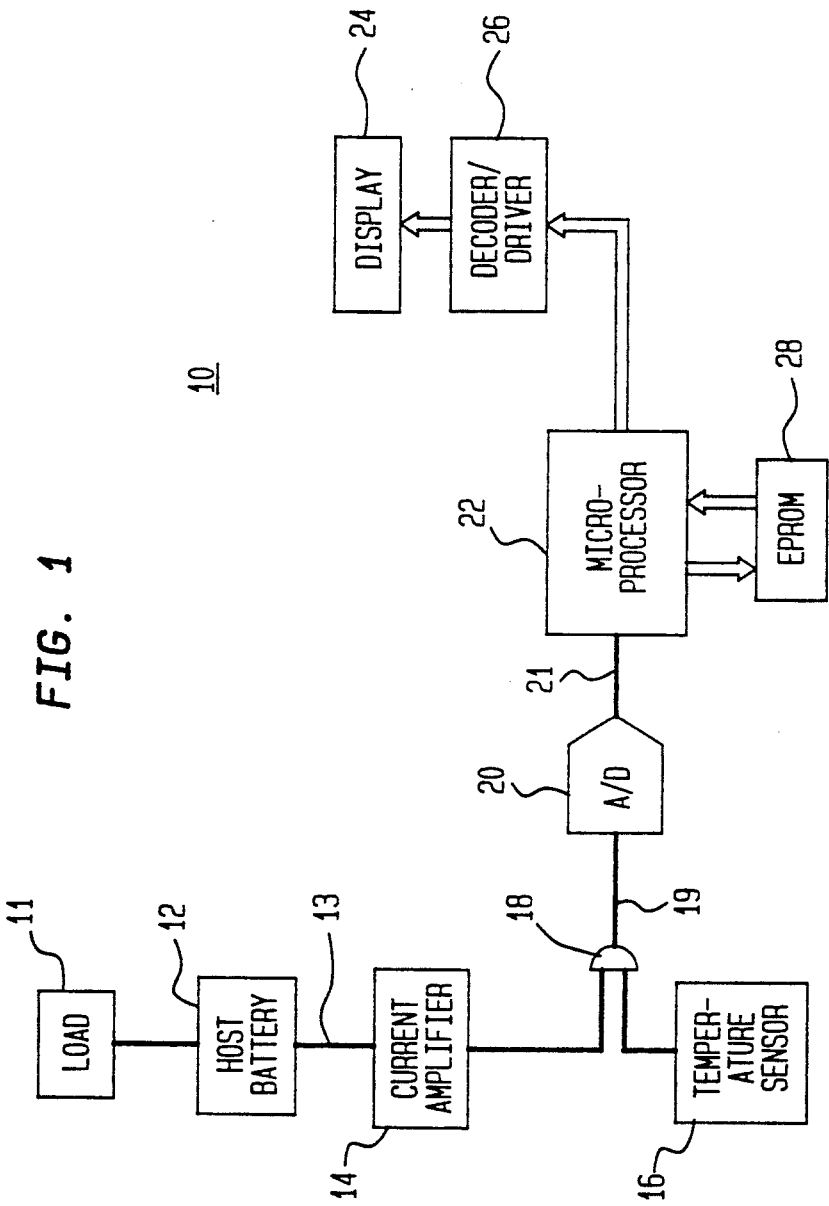
FIG. 1 shows a simplified block diagram representation of the lithium battery energy monitor system of the present invention.

Referring now to FIG. 1, there is shown lithium battery energy monitor system 10 of the present invention. Lithium battery energy monitor system 10 monitors host battery 12 and provides a display on display unit 24 for indicating the percent of charge remaining in host battery 12. Current amplifier 14 of energy monitor system 10 detects when host battery 12 provides load current to load 11. A signal representative of the load current is applied to microprocessor controller 22 by current amplifier 14 by way of input multiplexer 18 and analog-to-digital converter 20.

Since load current readings of current amplifier 14 are temperature sensitive, lithium battery energy monitor system 10 is provided with temperature sensor 16 for sensing the temperature of host battery 12. Temperature sensor 16 applies an electrical signal representative of the temperature of host battery 12 to microprocessor controller 22 by Way of input multiplexer 18 and analog-to-digital convertor 20. Microprocessor controller 22, executing programs stored in EPROM 28, keeps a running tally of the amount of energy used. A visual indication of the amount of load battery 12 energy remaining is provided on visual display 24 under the control of microprocessor controller 22 by wa of decoder/driver 26.

Figure 2:
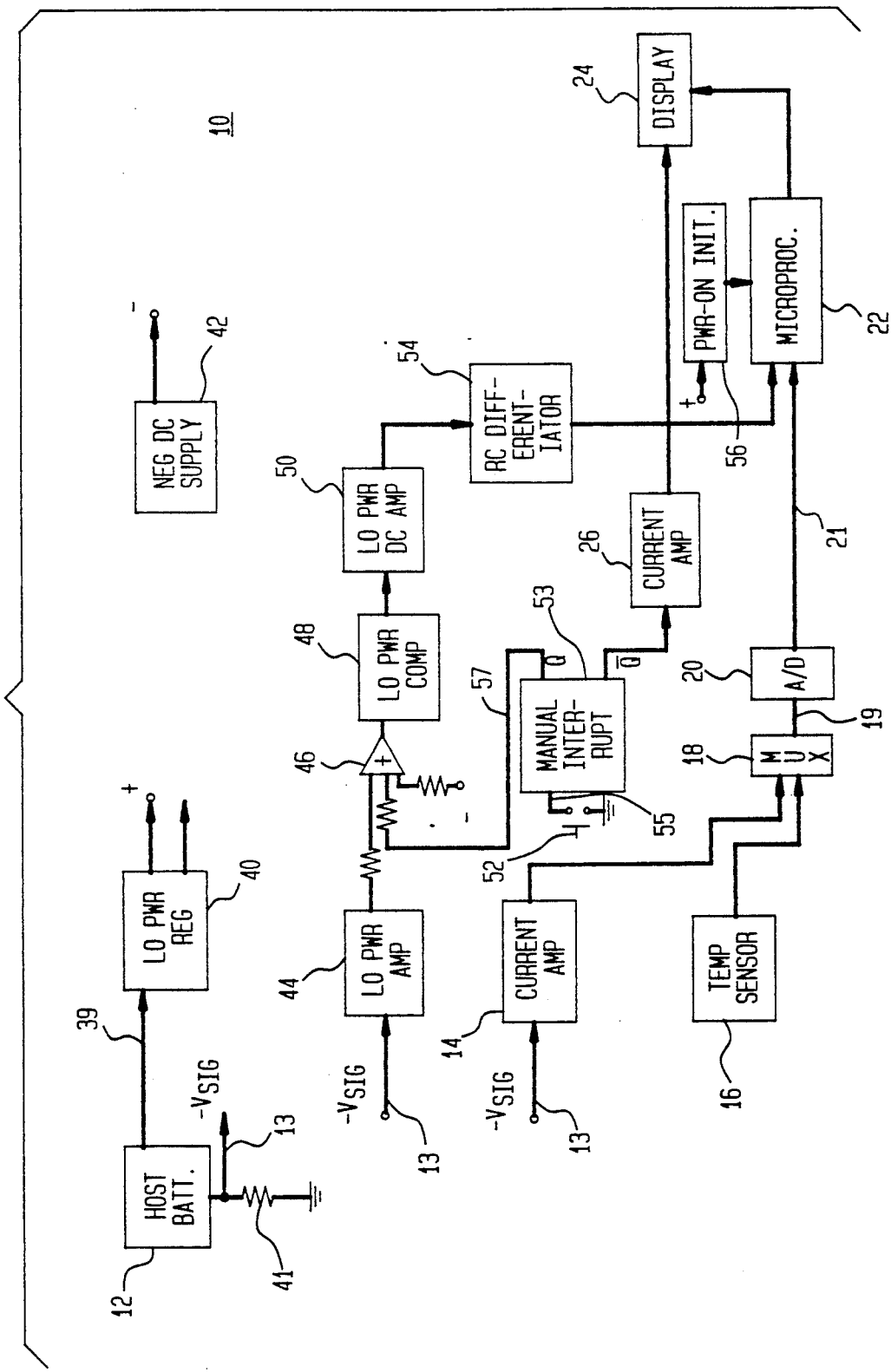
FIG. 2 shows a more detailed block diagram representation of the lithium battery energy monitor system of FIG. 1.

Referring now to FIG. 2, there is shown a more detailed schematic representation of lithium battery energy monitor system 10 of the present invention. Host battery 12 provides energy to low power regulators 40 by way of line 39 for operating the circuitry of lithium battery energy monitor system 10. Thus, the design of the circuitry of lithium battery energy monitor system 10 must be selected to minimize the amount of parasitic energy drain on host battery 12 resulting from energizing energy monitor system 10 by host battery 12. The circuitry of lithium battery monitor system 10 also requires negative DC supply 42 for providing operational amplifier negative reference voltages.

When an equipment load is applied to host battery 12, a negative voltage signal is sensed across two one-hundredths ohm sense resister 41 by way of voltage signal line 13. Voltage signal line 13 is also applied to current amplifier 14 as previously described. The output of current amplifier 14 may range from two hundred millivolts to five volts depending on the amount of load current demanded from energy monitor system 10 and the energy remaining in host battery 12. The voltage level at the output of current amplifier 14 is applied to input multiplexer 18 along with the output of temperature sensor 16 as previously described in order to be multiplexed into a single data line 19 for analog-to-digital conversion by analog-to-digital converter 20. After analog-to-digital conversion of the data signal on data line 19, the digital data signal is applied to microprocessor controller 22 by analog-to-digital converter 20. The output voltage level of temperature sensor 16 may be between approximately two and one-quarter volts and three and one-third volts.

The voltage signal of voltage signal line 13 is also applied to low power amplifier 44 for indicating that the load coupled to energy monitor system 10 has been activated and that measurement of the energy being provided by host battery 12 should be initialized by microprocessor controller 22. The output of low power amplifier 44 is applied to summing input 46 of low power comparator 48 for comparison with a negative voltage level and for summing and threshold detection. The output of low power comparator 48 is applied to low power DC amplifier 50 for inversion prior to differentiation by RC differentiator 54 and application to microprocessor controller 22.

In addition to initialization of this procedure in accordance with the voltage signal of voltage signal line 13 as applied to amplifier 44, this procedure may be initialized manually within lithium battery energy monitor system 10 by means of manual interrupt 53. Manual interrupt 53 is provided with a pushbutton switch 52 or a push-to-test switch 52. When pushbutton switch 52 is depressed, line 55 is grounded. Manual interrupt 53 provides debouncing of the negative going signal on line 55 due to depression of pushbutton switch 52. When pushbutton switch 52 is depressed and the resulting signal is debounced, manual interrupt 53 applies a signal to summing input 46 to initialize the process as previously described in connection with the signal provided to summing input 46 by low power amplifier 44. Additionally, when pushbutton switch 52 is depressed, manual interrupt 53 provides the signal to display driver 26 or current amplifier 26 for activating visual display 24 to provide a visual indication of the percent of energy remaining in host battery 12.

Figure 3:
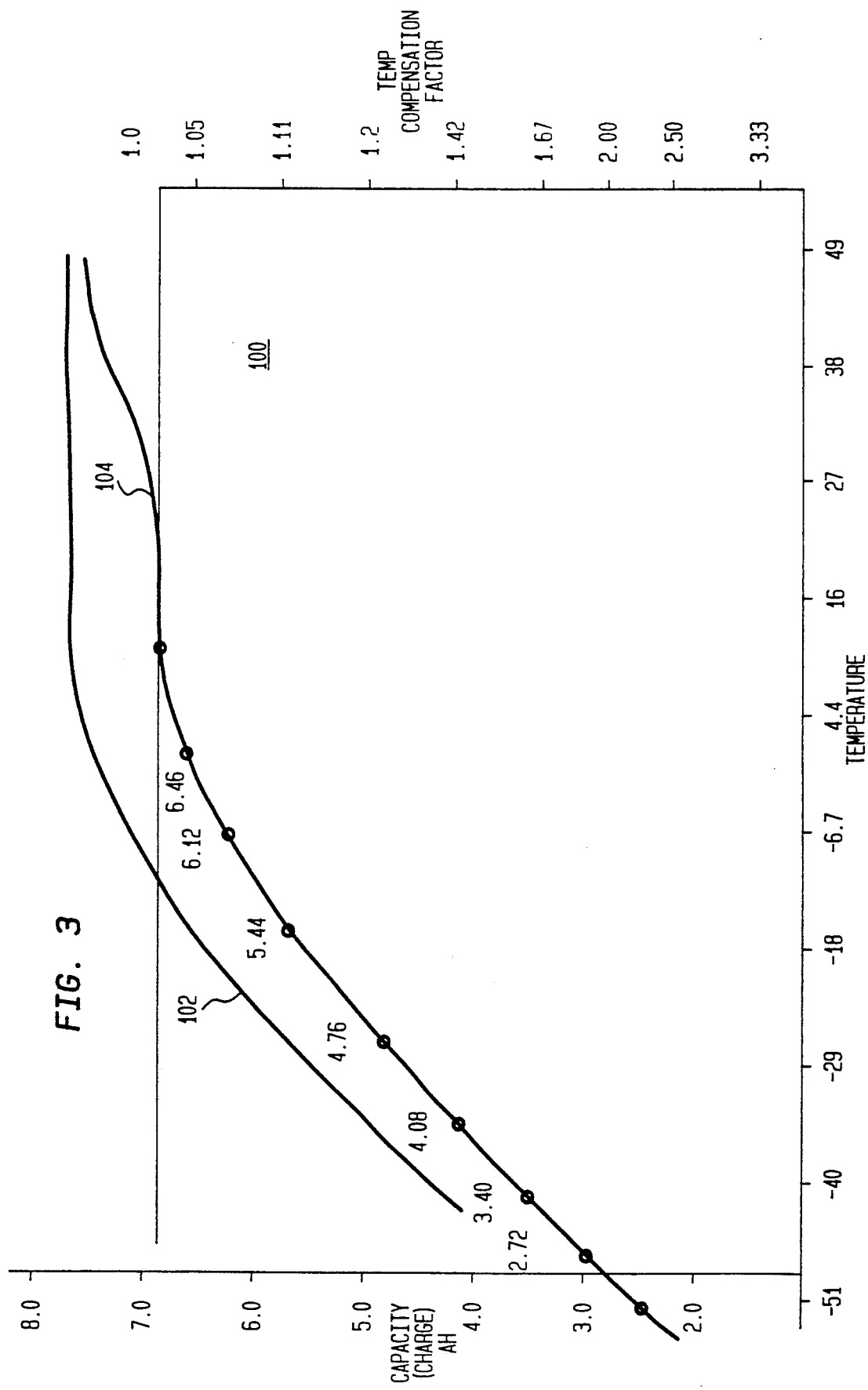
FIG. 3 shows a graphical representation of the relationship between temperature and the measured capacity of a host battery which may be monitored by the lithium battery energy monitor system of FIG. 1.

Referring to FIG. 3, there is shown temperature graph 100. Temperature graph 100 provides a graphical representation of the relationship between sample temperatures of host battery 12 and the measured charge capacity of host battery 12 taken at three different temperatures. Twelve different samples were taken to determine curves 102, 104 of temperature graph 100. Curve 102 of temperature graph 100 indicates the high limit of actual measured charge of samples of host battery 12 as a function of temperature. Curve 104 of temperature graph 100 represents the low limit of actual measured charge of the samples of host battery 12. An additional parameter, the temperature compensation factor, is shown on the right hand column or ordinate. The temperature compensation factor values are multipliers that increase in value as temperature curves 102, 104 fall off due to increased capacity at the low temperatures.

The temperature compensation factor is determined according to the relative ability of battery 12 to provide energy at differing temperatures. For example, when it is determined that a battery discharging at one temperature can only provide energy for one half the amount of time that the battery can provide energy at the reference temperature, a temperature compensation factor of two is determined. Thus any energy provided at that temperature is weighed twice as heavily as energy at the reference temperature when determining the cumulative energy used. For example, one ampere-hour at twenty degrees Fahrenheit weighs as heavily as two ampere-hours at seventy degrees Fahrenheit. Thus system 10 is a coulometer which corrects for temperature during discharging of battery 12 by selecting temperature compensation factor from a look-up table within microprocessor 22 according to the temperature sensed by temperature sensor 16.

Figure 4:
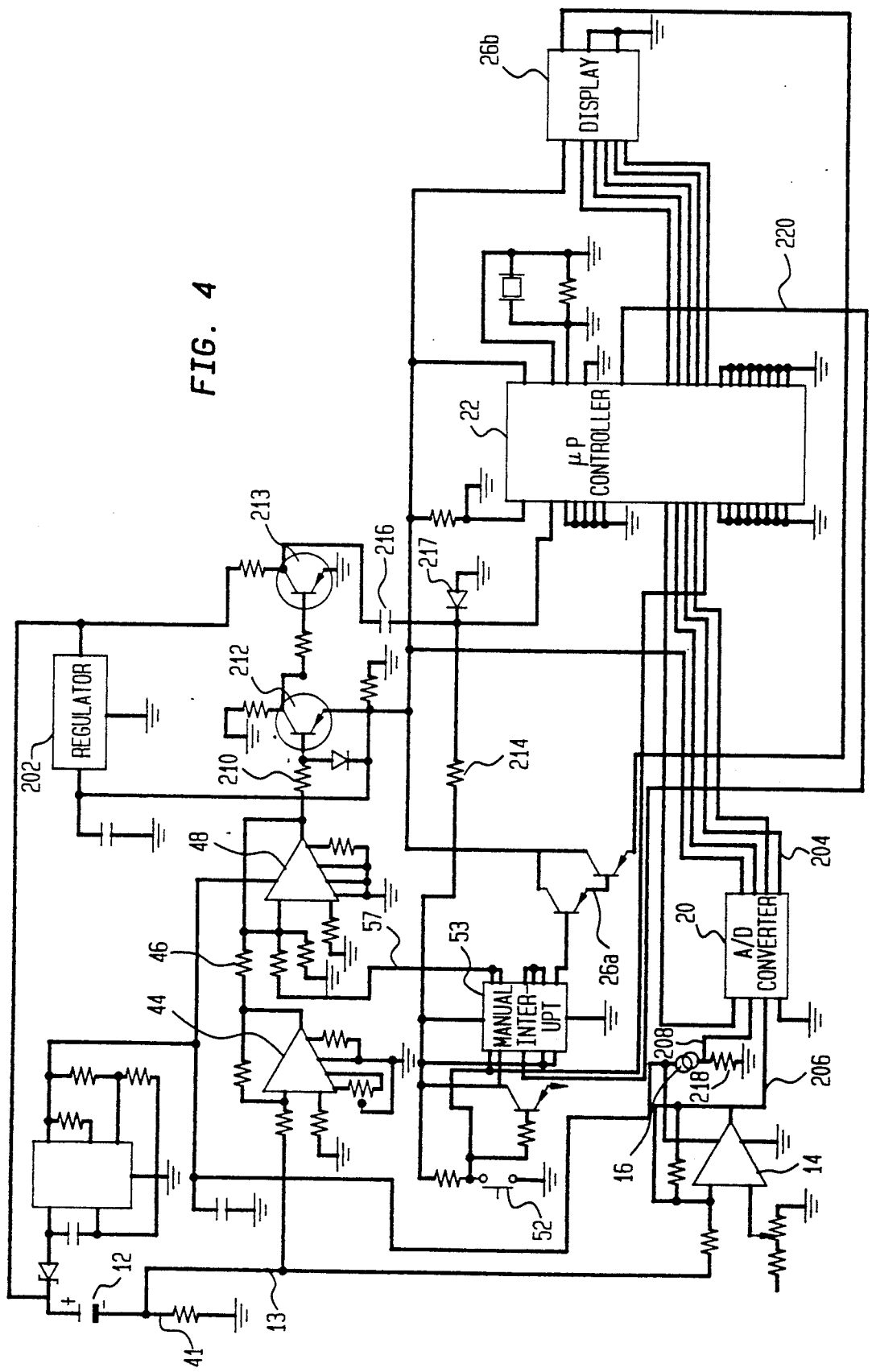
FIG. 4 shows a detailed schematic representation of the lithium battery energy monitor system of FIG. 1.
Figure 5:
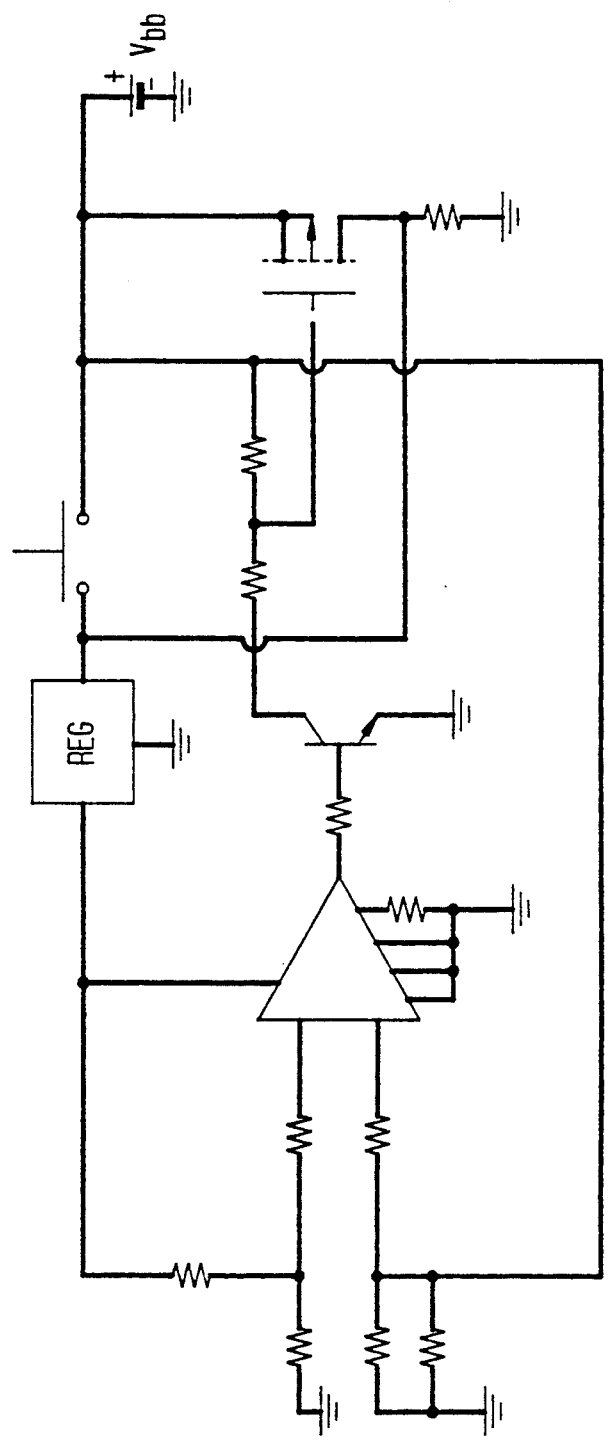

Referring now to FIG. 4, a more detailed schematic representation of lithium battery energy monitor system 10 is shown. Initialization of lithium battery energy monitor system 10 occurs when system lo is first connected to host battery 12. Regulator 202 of energy monitor system 10 supplies positive voltage to microprocessor controller 22. When this connection is made, voltage to microprocessor controller 22 is delayed through the RC integrator allowing microprocessor controller 22 to initialize. Under these circumstances, no load current from host battery 12 is present except a few milliamperes used to power lithium battery energy monitor system 10 in its operate mode.

During initialization energy monitor system 10 assumes a full charge value of 25,000 coulombs (6.9 AH) and stores it within microprocessor controller 22. This charge value is slightly greater than the 24,480 coulombs specified charge value for an unused host battery 12. In the next step, temperature sensor 16 is read by microprocessor controller 22 in order to determine whether temperature sensor 16 provides an in-range value. If the reading of temperature sensor 16 by way of analog-to-digital converter 20 is out of range, an error signal is provided by microprocessor controller 22 and displayed on visual display 24. Out-of-range values for this reading of temperature sensor 16 by way of analog-to-digital converter 20 may be less than approximately two and one-quarter volts or greater than three and one-third volts.

Microprocessor controller 22 then determines the level of current amplifier 14 to detect out-of-range current, also by way of analog-to-digital converter 20. If the load current of host battery 12 is greater than twenty milliamperes, an indication is provided on visual display 24. If the temperature and current data are both within the specified ranges, as determined by microprocessor controller readings of temperature sensor 16 and current amplifier 14 respectively, an indication is provided. Microprocessor controller then turns off, clears the power-on control line, enables the interrupts of microprocessor controller 22 and stops the oscillator. Microprocessor controller 22 is then in the stop mode and is activated only by an external interrupt signal indicating energizing of the load.

The initialization mode is entered by energy monitor system 10 when host battery 12 is in its assembly case (not shown) and the transceiver load powered by host battery 12 is in either the transmit mode or the receive mode.

Microprocessor controller 22 is thus activated and data is processed when an interrupt signal appears, sending execution of microprocessor controller 22 to internal initialization routines. Current to the transceiver load is detected as a negative voltage signal on voltage signal line 13 at input sense resistor 41 as previously described. This voltage signal of line 13 is applied to inverting amplifier 44, summer 46, and comparator 48. Inverting amplifier 44, summer 46 and comparator 48 combine to detect current in excess of one hundred milliamperes and apply a low state output to base resistor 210 of normally off PNP transistor 212.

Transistors 212, 213 are a cascaded, complementary amplifier pair providing low power standby and voltage amplification when conducting. A negative going voltage at the collector of transistor 213 is differentiated by the combination of capacitor 216 and diode 217 and applied to microprocessor controller 22. Resistor 214 provides recharging of capacitor 216 to positive five volts. Microprocessor controller 22 then determines whether an interrupt was due to load current by detecting the status of push-to-test switch 52.

Microprocessor controller 22 then provides the necessary control signal to analog-to-digital converter 20 to acquire a digital value of the load current. This data is stored. Microprocessor controller 22 then acquires a temperature sample by way of line 204. Current and temperature inputs are continuously provided to microprocessor controller 22 by way of lines 206, 208, respectively. Inverting amplifier-integrator 14 provides a calibrated voltage gain of one-hundred at zero offset to analog-to-digital converter 20. Current amplifier 14, in cascade with sense resister 41, applies a voltage between approximately two-tenths of a volt and five volts to analog-to-digital converter 20. This voltage represents transceiver operation in the receive mode at one-hundred milliamps, or a high level of two and one-half amperes in the transmit mode. These currents, by way of two one-hundredths ohm current sensing resister 41, generate a two millivolt or fifty millivolt signal, respectively. This signal, when provided to current amplifier 14 having a gain of one-hundred, results in approximately two-tenths of a volt or five volts, respectively.

Temperature sensor 16 provides one microampere per degree Kelvin (1ua/°K) linear output over the useful range of energy monitor system 10. This current is supplied to resistor 218 for applying a continuous voltage to analog-to-digital convertor 20 ranging from approximately two and one-quarter volts to three and one-third volts. This voltage range applied by temperature sensor 16 represents a temperature range of approximately negative forty seven degrees to positive sixty degrees centigrade Microprocessor controller 22 decrements charge accordingly from the starting value of 25,000 coulombs.

As previously described, an interrupt is provided for interrogating lithium battery energy monitor system 10 to determine the percent level of charge remaining in host battery 12. The interrogation can only be performed when the host batteries are removed from the assembly case (not shown). Energy monitor system 10 resides either on or in host battery 12. Two batteries are required in the battery assembly case. The battery case mounts on the PRC-204 marine field radio or transceiver or other suitable battery powered system.

Switch 52 may be depressed to provide a negative level to manual interrupt 53 which provides debouncing as previously described. Manual interrupt true output line 57 is applied to summing input 46 of comparator 48. This enables the interrupt request of microprocessor controller 22 which in turn enables visual display 24 as previously described. When the interrupt request routine of microprocessor controller 22 determines that push-to-test switch 52 has been depressed, the charge remaining in host battery 12 is determined and appropriate characters are enabled on display 26b. An LED control signal is enabled by microprocessor controller 22 and applied to pin 9, IC5, by way of line 220 in order to provide voltage to darlington amplifier 26a. Darlington amplifier 26a provides high current LED capability for operating display 24 by way of decoder 26b.

The push-to-test status function is provided within lithium battery energy monitor system 10 to prevent visual display 24 from consuming power except when in use. Energy monitor system 10 initializes when first connected to host battery 12 and must remain connected to host battery 12 until host battery 12 is expended in order to provide accurate measurements. In addition to monitoring the current drain of host battery 12, the temperature is also monitored by energy monitor system 10 since the rate of host battery 12 discharge varies significantly with temperature. Eight-bit analog-to-digital converter 20 is provided within energy monitor system 10 to convert the voltage and load 1 current levels detected by current sensor 14 into digital format and transfer this data to microprocessor controller 22 over microwire interface 204. Operation of energy monitor system 10 is under program control in accordance with commands stored in EPROM 28. Lithium energy monitor system 10 may be fabricated on a circuit board approximately two inches by four inches using medium scale integration. Using large scale integration and application specific integrated circuits, temperature compensated lithium energy monitor system 10 may be formed as a low power timing device in a size approximately equal to the size of a digital quartz watch.

Many modifications and variations of the present invention are possible in view of the above disclosure. It is therefore to be understood, that within the scope of the appended claims, the invention may be practice otherwise than as specifically described.

I claim:

1. A method for monitoring the charge of a battery, comprising the steps of:
   (a) determining first and second temperatures at differing times;
   (b) determining first and second temperature compensation factors in accordance with said first and second temperatures respectively wherein said first and second temperature compensation factors differ from each other;
   (c) determining first and second charge usages while said battery discharges at said first and second temperatures respectively,
   (d) compensating said determined first and second charge usages in accordance with said first and second temperature compensation factors respectively; and,
   (e) determining cumulative charge usage in accordance with said first and second compensated charge usages, whereby said cumulative charge usage is determined in accordance with differing temperature compensation factors.

2. The method for monitoring the charge of a battery of claim 1, wherein step (b) comprises determining a relationship between a first time value, representative of discharge durations of a battery at said first and second determined temperatures, and a second time value, representative of discharge duration of said battery at a reference temperature.

3. The method for monitoring the charge of a battery of claim 2, comprising the further steps of:
   (f) determining a plurality of said relationships at differing temperatures; and,
   (g) storing said plurality of determined relationships.

4. The method for monitoring the charge of a battery of claim 3, wherein step (b) comprises selecting a determined stored relationship of said plurality of stored relationships in accordance with said first temperature.

5. The method for monitoring the charge of a battery of claim 1, comprising the further step of determining the percent of charge remaining in said battery in accordance with said cumulative charge usage.

6. The method for monitoring the charge of a battery of claim 5, comprising the further step of providing a display in accordance with said determined percentage of charge remaining.

7. The method for monitoring the charge of a battery of claim 5, comprising the further steps of:
   (j) selecting a starting value of stored charge; and,
   (k) decreasing the value of stored charge in accordance with said compensated charge usage.

8. The method for monitoring the charge of a battery of claim 1, comprising the further step of providing a display representative of said compensated charge usage.

9. The method for monitoring the charge of a battery of claim 8, comprising the further steps of:
   (h) providing a display switch; and,
   (i) displaying in accordance with said display switch.

10. The method for monitoring the charge of a battery of claim 1, wherein step (c) comprises determining the amount of current provided by said battery.

* * * * *